United States Patent
Baumgarte (10) Patent No.: US 9,608,588 B2
(45) Date of Patent: Mar. 28, 2017

(54) DYNAMIC RANGE CONTROL WITH LARGE LOOK-AHEAD

(71) Applicant: Apple Inc., Cupertino, CA (US)

(72) Inventor: Frank M. Baumgarte, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 139 days.

(21) Appl. No.: 14/301,269

(22) Filed: Jun. 10, 2014

(65) Prior Publication Data

US 2015/0207479 A1    Jul. 23, 2015

Related U.S. Application Data

(60) Provisional application No. 61/930,394, filed on Jan. 22, 2014.

(51) Int. Cl.
*G10L 21/00* (2013.01)
*H03G 9/02* (2006.01)

(52) U.S. Cl.
CPC .................. *H03G 9/025* (2013.01)

(58) Field of Classification Search
CPC .... H03G 3/3089; H03G 9/025; H03G 3/3005; G10H 1/366; G10H 2210/261
(Continued)

(56) References Cited

U.S. PATENT DOCUMENTS 5,471,651 A * 11/1995 Wilson ................... H03G 7/007
                                                        333/14
5,530,767 A *  6/1996 Yoshida ............... H03G 3/3052
                                                        379/395

(Continued)

FOREIGN PATENT DOCUMENTS

JP         2009296298    12/2009
WO    WO-2011/141772 A1   11/2011
(Continued)

OTHER PUBLICATIONS

International telecommunications Union, ITU-R Radiocommunication Sector of ITU. "Algorithms to Measure Audio Programme Loudness and True-Peak Audio Level," Recommendation ITU-R BS.1770-3. Geneva, Switzerland (Aug. 2012). 24 pages.
(Continued)

*Primary Examiner* — Michael Colucci (74) *Attorney, Agent, or Firm* — Blakely, Sokoloff, Taylor & Zafman LLP (57) ABSTRACT

A system and method applying Dynamic Range Control/Compression (DRC) to an audio signal. The dynamic range controller presented here differs from conventional DRC techniques by providing a much larger look-ahead time. In particular, the system and method takes advantage of the look-ahead by analyzing macroscopic loudness changes in the order of seconds as opposed to the microscopic changes most conventional DRCs are designed to control. This approach avoids most of the typical DRC distortions associated with conventional DRC techniques and preserves the micro-dynamics of the audio signal. Gain changes are applied at a rate comparable with manual volume adjustments by mixing and mastering engineers to balance a mix. Ideally, the DRC will approach what a professional sound engineer would do to reduce the dynamic range if there were only a volume control to accomplish the task on the final mix.

23 Claims, 4 Drawing Sheets

(58) Field of Classification Search
USPC ........ 704/211, 206, 215, 225; 381/104, 106, 381/107; 455/72
See application file for complete search history.

(56) References Cited

U.S. PATENT DOCUMENTS

| | | | | |
|---|---|---|---|---|
| 6,148,086 | A * | 11/2000 | Ciullo | G10H 1/366 381/106 |
| 6,782,366 | B1 | 8/2004 | Huang et al. | |
| 7,155,385 | B2 * | 12/2006 | Berestesky | H03G 3/3089 704/215 |
| 8,085,941 | B2 | 12/2011 | Taenzer | |
| 8,199,933 | B2 * | 6/2012 | Seefeldt | H04S 7/00 381/104 |
| 8,355,909 | B2 * | 1/2013 | Carroll | H03G 7/007 704/200 |
| 8,428,270 | B2 | 4/2013 | Crockett et al. | |
| 8,437,480 | B2 | 5/2013 | Zong et al. | |
| 8,892,426 | B2 * | 11/2014 | Smithers | H03G 9/005 704/200 |
| 2003/0091196 | A1 * | 5/2003 | Spencer | G10K 15/02 381/58 |
| 2005/0147262 | A1 * | 7/2005 | Breebaart | H03G 7/007 381/106 |
| 2006/0087380 | A1 * | 4/2006 | Hohmann | H03G 9/025 333/14 |
| 2007/0291959 | A1 * | 12/2007 | Seefeldt | H03G 3/32 381/104 |
| 2009/0074209 | A1 * | 3/2009 | Thompson | H03G 9/005 381/107 |
| 2009/0220109 | A1 * | 9/2009 | Crockett | H03G 3/3089 381/107 |
| 2010/0083344 | A1 * | 4/2010 | Schildbach | H03G 7/007 725/151 |
| 2010/0250258 | A1 | 9/2010 | Smithers et al. | |
| 2010/0310085 | A1 | 12/2010 | Oh et al. | |
| 2011/0085677 | A1 | 4/2011 | Walsh et al. | |
| 2012/0224611 | A1 | 9/2012 | Baheti et al. | |
| 2012/0310654 | A1 | 12/2012 | Riedmiller et al. | |
| 2013/0156229 | A1 | 6/2013 | Riedl | |
| 2014/0117959 | A1 * | 5/2014 | Costa | H02M 3/157 323/282 |

FOREIGN PATENT DOCUMENTS

| | | |
|---|---|---|
| WO | WO-2013/041875 A2 | 3/2013 |
| WO | WO-2013/068637 A1 | 5/2013 |

OTHER PUBLICATIONS

Fraunhofer IIS. "White Paper HE-AAC Metadata for Digital Broadcasting." (Sep. 2011). 16 pages.
ATSC. "A/53:ATSC Digital Television Standard, Parts 1-6." Advanced Television Systems Committee, Inc. Washington, D.C. (Jan. 2007). 136 pages.
ATSC. "ATSC Recommended Practice: Techniques for Establishing and Maintaining Audio Loudness for Digital Television." Document A/85:2011. Advanced Television Systems Committee, Inc. Washington, D.C. (Jul. 2011). 76 pages.
ATSC. "ATSC Standard: Digital Audio Compression (AC-3, E-AC-3)." *Advanced Television Systems Committee*. Doc. A/52: 2012. Washington, D.C. (Dec. 2012). 270 pages.
Baumgarte, et al. "Workin Draft on Dynamic Range Control." ISO/IEC. JCT1/SC29/WG11 MPEG2013/N14067. Geneva, Switzerland (Nov. 2013). 32 pages.
Dolby Laboratories, Inc. "Dolby Metadata Guide." Issue 3, S05/14660/16797 (2005). 28 pages.
EBU-UER. "EBU Recommendation R 128 "Loudness Normalisation and Permitted Maximum Level of Audio Signals"", Geneva, Switzerland (Aug. 2011). 5 pages.
ETSI. "Digital Video Broadcasting (DVB); Specification for the Use of Video and Audio Coding in Broadcasting Applications Based on the MPEG-2 Transport Stream." ETSI TS 101 154 v1.11.1. European Telecommunication Standards Institute (2012); European Broadcasting Union (2012). 195 pages.
Giannoulis, D. "A Design of a Digital, Parameter-automated, Dynamic Range Compressor." MSC Project Report, Queen Mary University of London (Aug. 26, 2010). 92 pages.
ISO/IEC. "Coding of Moving Pictures and Audio." ISO/IEC 13818-7, International Standard (2003). 206 pages.
ISO/IEC. "Information Technology—Coding of Audio-Visual Objects—Part 3: Audio." ISO/IEC 14496-3, Subpart 4, International Standard (2009). 150 pages.
ISO/IEC. "ISO/IEC 14496-3:200X(E)." Fourth Edition, Switzerland (2009). 150 pages.
ISO/MPEG. "On ISO/IEC 14496-12 Technologies under Consideration: Enhanced Audio Support." Contribution M29150, 104th MPEG meeting, Incheon, Korea (Apr. 2013). 14 pages.
ISO/MPEG. "Enhanced Metadata for Dynamic Range Compression." Contribution M28901, 104th MPEG meeting. Incheon, Korea, (Apr. 2013). 10 pages.
ISO/MPEG. "Information Technology—MPEG Audio Technologies—Part 1: MPEG Surround." ISO/IEC FDIS 23003-1 (2006). 294 pages.
ISO/MPEG. "Information Technology—MPEG Audio Technologies—Part 2: Spatial Audio Object Coding." ISO/IEC FDIS 23003-2 (2010). 286 pages.
ISO/MPEG. "Timeline and Requirements for MPEG-H 3D Audio Version 1." ISO/IEC JTC1/SC29/WG11 N13855. Vienna, Austria (Aug. 2013). 3 pages.
ISO/MPEG. "Improved Audio Support in the ISO Base Media File Format." ISO/IEC JCT1/SC29/WG11, MPEG2013/m31470. Geneva, Switzerland (Oct. 23, 2013). 12 pages.
ISO/MPEG. "Information Technology—MPEG Audio Technologies—Part 3: Unified Speech and Audio Coding." ISO/IEC FDIS 23003-3:2011 (2011). 286 pages.
ISO/MPEG. "Proposed Revision of Audio Aspects of WD: Addition of Sample Aspect Ratio and further Audio Code-Points." ISO/IEC JCT1/SC29/WG11/N13855. Vienna, Austria (Jul. 2013). 7 pages.
Massberg, M. "Investigation in Dynamic Range Compression." MSC Project Report, Queen Mary University of London (Aug. 25, 2009). 66 pages.
Singer, et al. "Working Draft for Aspect Ratio Amendment to CICP." ISO/IEC/JTC1/SC29/WG11/N13595. Incheon, Korea (Apr. 2013). 6 pages.
Wang, et al. "Modified Discrete Cosine Transform—Its Implications for Audio Coding and Error Concealment." JAES, vol. 51, No. 1/2, Jan./Feb. 2003. 10 pages.

* cited by examiner

DYNAMIC RANGE CONTROL WITH LARGE LOOK-AHEAD

RELATED MATTERS

This application claims the benefit of the earlier filing date of provisional application No. 61/930,394, filed Jan. 22, 2014.

FIELD

An embodiment of the invention generally relates to a system and method for applying Dynamic Range Control/Compression (DRC) to an audio signal using a large look-ahead.

BACKGROUND

Dynamic Range Control (DRC) of audio signals has various applications. Commonly, DRC will reduce the dynamic range of an audio signal by some amount by either making soft parts louder, making loud parts softer, or both. A reduced dynamic range is desirable for playback systems that can only reproduce a small dynamic range while maintaining low distortions, in listening environments with distracting sounds, or in situations where the listener does not want to distract others.

DRC evolved from analog hardware to digital algorithms that mimic the analog behavior. The inherent nonlinear behavior of common DRCs can produce audible distortions that occur as harmonic distortions, pumping (gain changes), and modulations.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

SUMMARY

An embodiment of the invention generally relates to a system and method for applying Dynamic Range Control/Compression (DRC) to an audio signal. The dynamic range controller presented here differs from conventional DRCs by providing a much larger look-ahead time. In particular, the system and method takes advantage of the look-ahead by analyzing macroscopic loudness changes in the order of seconds as opposed to the microscopic changes most conventional DRCs are designed to control.

This approach avoids most of the typical DRC distortions associated with conventional DRCs and preserves the microdynamics of the audio signal. Gain changes are applied at a rate comparable with manual volume adjustments by mixing and mastering engineers to balance a mix. Ideally, the DRC will approach what a professional sound engineer would do to reduce the dynamic range if there were only a volume control to accomplish the task on the final mix.

Overall, the large look-ahead permits detection of large loudness changes over the look-ahead time frame and careful timing of the gain adaptation rate adjustments. This is accomplished by robust metrics of the loudness change that result in smooth and non-disturbing gain adjustments for greatly improved listener experience in certain playback scenarios.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

The dynamic range control (DRC) techniques presented herein take advantage of a larger look-ahead in comparison to traditional DRC systems. Hence, the application of the DRC techniques described herein may exclude real-time two-way communications, such as conferencing or telephony. However, the DRC techniques discussed herein may be used in applications that allow a look-ahead in the order of 10 seconds without generating annoying or undesirable delays for the user. These applications include offline encoding of content libraries, broadcasting, and other applications that can absorb a long look-ahead such as in file-based processing.

The look-ahead in DRC is used to evaluate how the loudness evolves and whether adjustments are necessary. If adjustments are necessary, a smooth gain change is applied during loudness transitions in order to avoid undesirable loudness changes. Moreover, the rate of the gain changes is adapted to the content to hide the changes within given loudness transitions of the content.

Dynamic Range Control Algorithm

A time-domain (single band) DRC generates time-dependent gain values that are applied to an audio signal (i.e., the audio signal is modulated by the gain values over time). Commonly, the gain values are small (i.e., smaller than unity gain) when the audio signal has larger amounts of energy. In contrast, the gain values are larger (i.e., larger than unity gain) when the audio signal has smaller amounts of energy.

Figure 1:
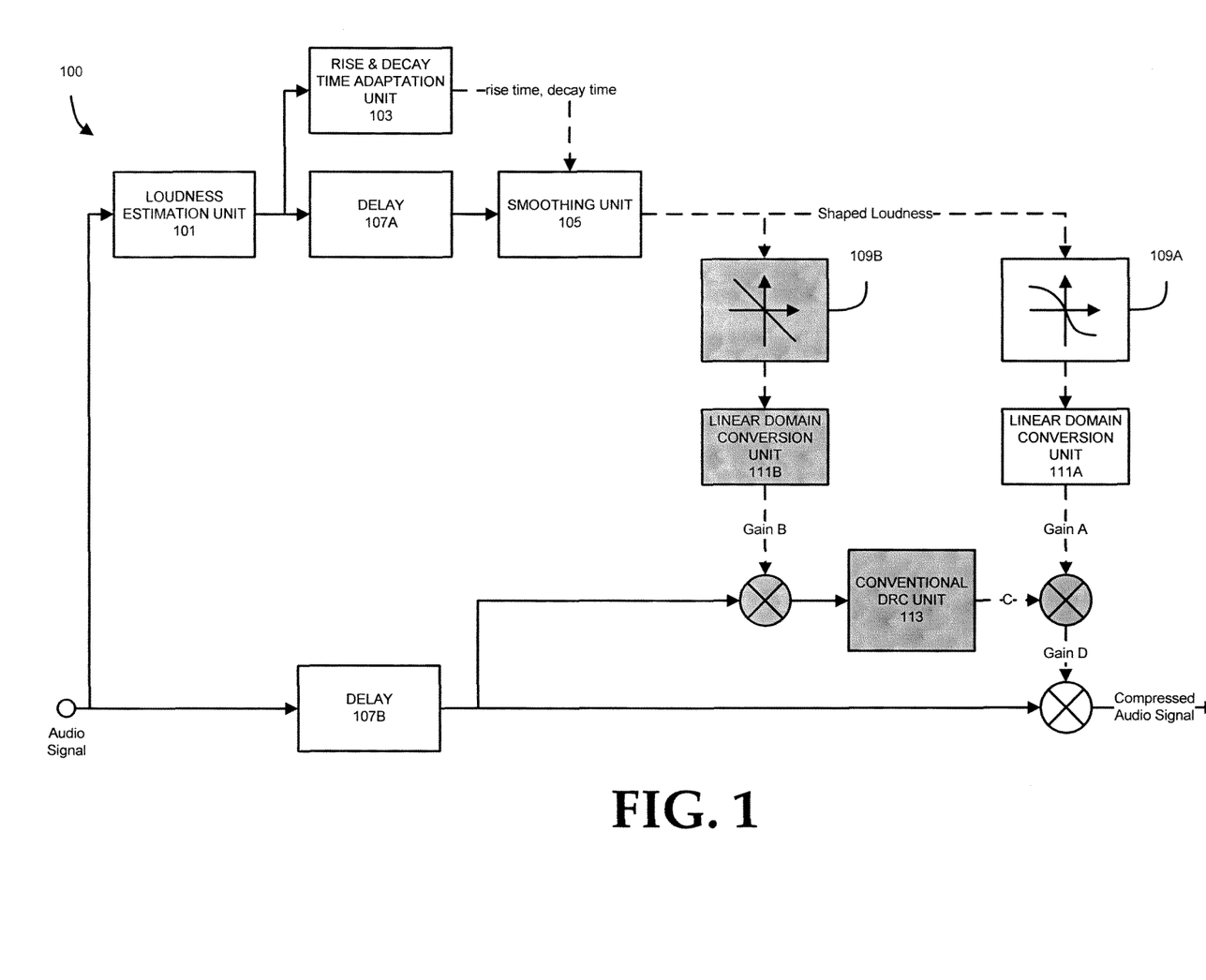
FIG. 1 shows a block diagram of a system and method for performing dynamic range control (DRC) according to one embodiment.

The DRC system 100 shown in FIG. 1 is based on a short-term loudness estimate of an audio signal, because loudness is a relevant quantity for controlling perceived loudness dynamics. In one embodiment, the loudness estimate computed by the loudness estimation unit 101 is used to compute the DRC gain values by applying smoothing with adaptive time constants. The time constants are derived from an analysis of the loudness estimate during the look-ahead duration. In one embodiment, this computation of time constants is done in the rise and decay time adaptation unit 103 in the system 100 of FIG. 1 after a corresponding delay is applied to the loudness estimation by the delay unit 107A. The adaptive time constants control the smoothing unit 105 (i.e., the smoothed output will follow the input faster for smaller time constants).

Following the right-most downward path in FIG. 1, an input/output characteristic is applied by the characteristic unit 109A to derive the final DRC gain. The characteristic unit 109A controls how much compression is applied to the audio signal. Finally, the gain produced by the characteristic unit 109A is converted from the loudness domain to the linear domain by the linear domain conversion unit 111A to produce the gain value A. The gain value A may thereafter be applied to the audio signal (assuming that gain C is equal to 1). The additional shaded blocks in FIG. 1 will be explained below.

Figure 2:
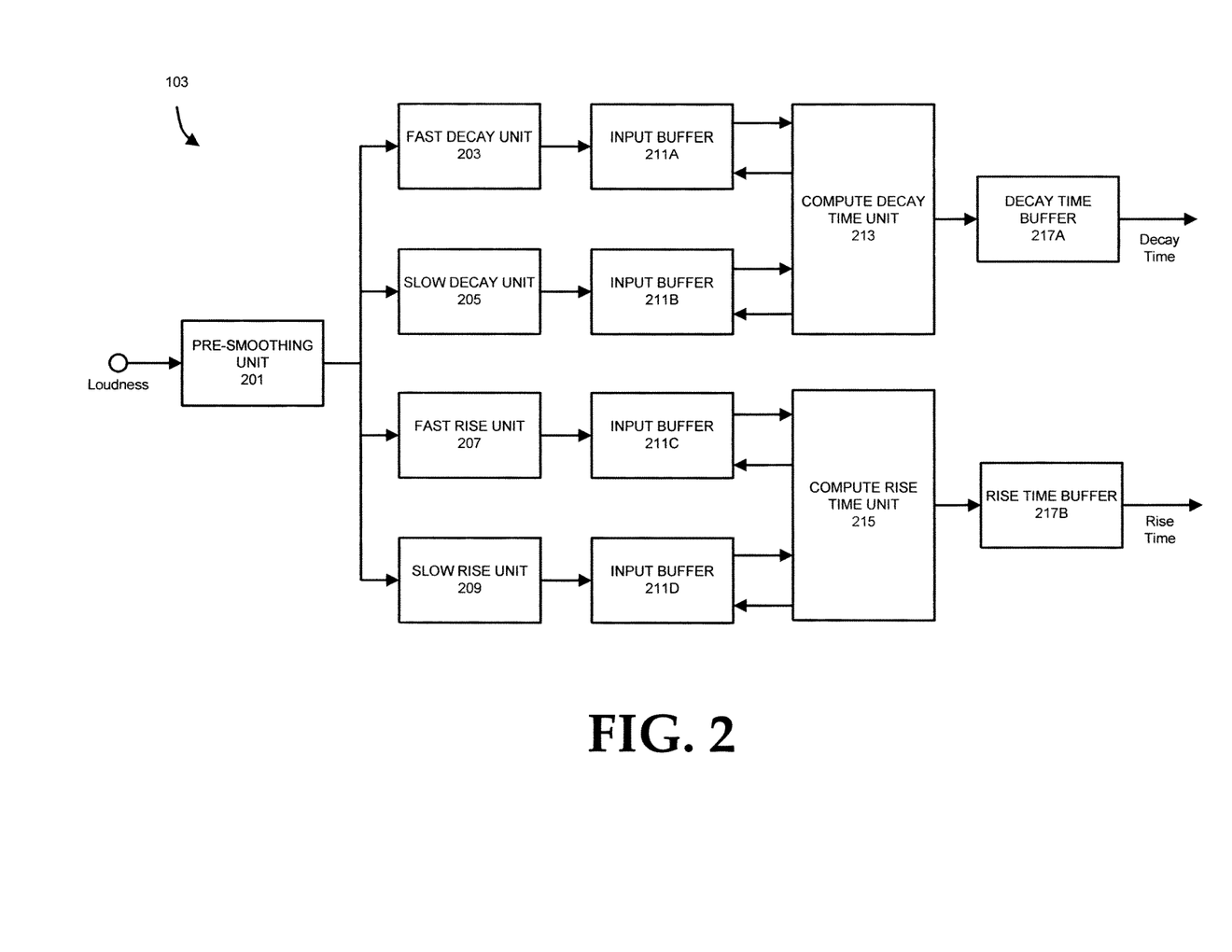
FIG. 2 shows a block diagram of a rise and decay adaptation unit according to one embodiment.

The core of the DRC system 100 described herein is the rise and decay time adaptation performed by the rise and decay time adaptation unit 103 shown in FIG. 2. First, a pre-smoothing of the loudness estimate may be performed by the pre-smoothing unit 201 to smooth out transient peaks and dips. Based on the pre-smoothed loudness, several decay and rise slopes are computed in parallel by the fast decay unit 203, the slow decay unit 205, the fast rise unit 207, and/or the slow rise unit 209. For example, a decay slope $l_D$ may be computed as shown below:

$$l_D(n) = \begin{cases} w_D l_D(n-1) & \text{if} \quad l_D(n-1) > l_{presmooth}(n) \\ l_{presmooth}(n) & \text{else} \end{cases}.$$

A rise slope $l_D$ may be computed by:

$$l_R(n) = \begin{cases} w_R l_R(n-1) & \text{if} \quad l_R(n-1) < l_{presmooth}(n) \\ l_{presmooth}(n) & \text{else} \end{cases}.$$

The weighting factors $w_D$ and $w_R$ may be computed from the decay and rise time constants. The pre-smoothed loudness is $l_{presmooth}$ and the time index is denoted as n. A weighting factor w may be computed from a time constant $\tau$ in seconds and a sample rate $f_s$ in Hz as follows:

$$w = \exp\left(-\frac{1}{\tau f_s}\right)$$

The decay and rise slopes may be shifted into input buffers 211A-211D that hold the entire look-ahead duration. The compute decay time unit 213 and the compute rise time unit 215 analyze the buffer 211A-211D content and may modify it as explained below.

Figure 3:
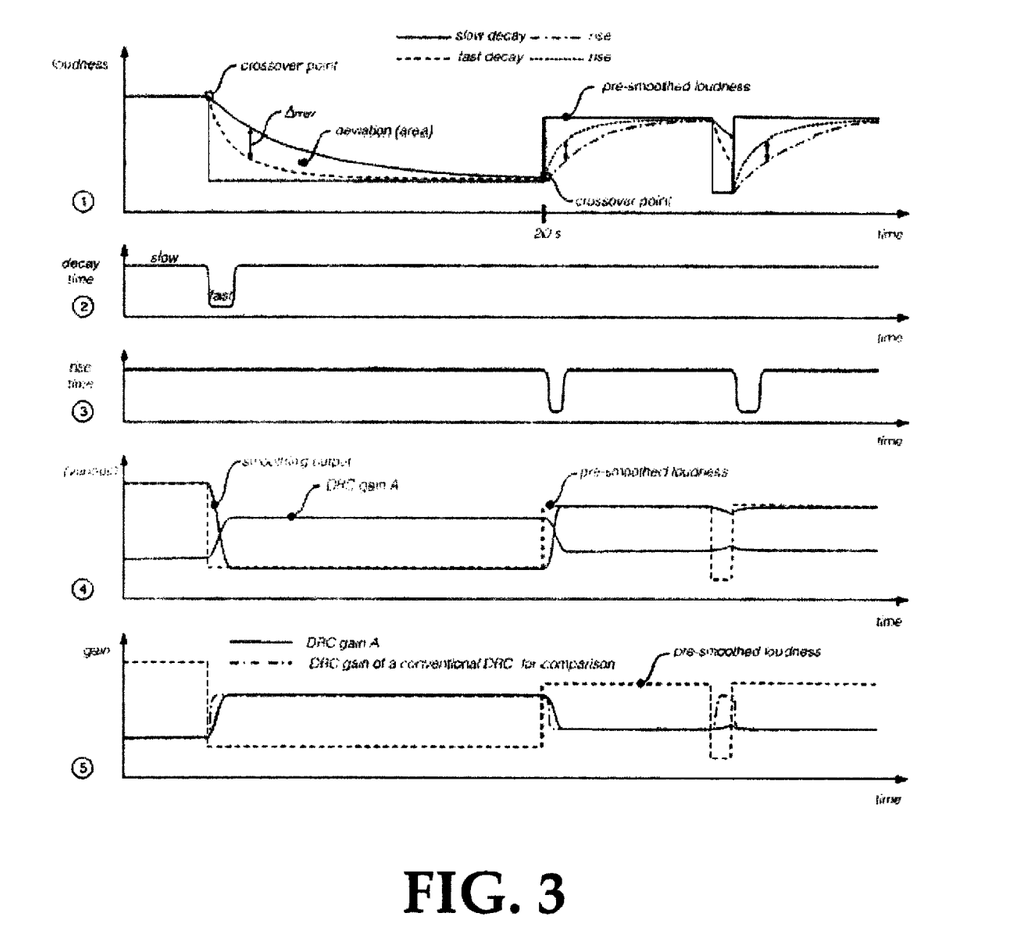
FIG. 3 shows example types of DRC signals and time constant adaptation according to one embodiment.

The example at the top of FIG. 3 shows the pre-smoothed loudness curve (bold) and the various outputs of the rise and decay units 203, 205, 207, and/or 209. For instance, when the pre-smoothed loudness drops in the beginning, a slow (solid) and fast (dashed) decay slope is generated starting at the crossover point. Later, when the pre-smoothed loudness increases, a slow and fast rise curve is generated, while the decay curves follow the pre-smoothed loudness in that part.

The difference between the slow curve and the fast curve is now used as a measure of loudness change. For instance, the area between these curves can be used to estimate the amount of loudness change for decreasing loudness:

$$\Delta_{l,d} = \sum_{k=Ncrossover}^{n} l_{d,slow}(k) - l_{d,fast}(k)$$

Or for increasing loudness:

$$\Delta_{l,r} = \sum_{k=Ncrossover}^{n} l_{r,fast}(k) - l_{r,slow}(k)$$

The loudness change is large if there is a significant change in loudness over a significant amount of time. This will cause the selection of a faster time constant for the smoothing unit 105, so that the smoothing unit 105 will be able to track the loudness change when it occurs. The fast time constant will be active starting from the last crossover point for a certain duration. The duration is a fraction of the duration occurring between the crossover point and the time when the maximum difference between the slow and fast curve occurs. The crossover point is defined as the last time instance where the slow and fast curves have equal values or cross each other. The time constants are buffered by the buffers 217A and 217B for the entire look-ahead duration so that the time constants may be modified at any time within that time frame.

If the loudness change $\Delta_{l,d}$ or $\Delta_{l,r}$ is small, such as during the small dip in FIG. 3, the smoothing time constant remains large and the smoothing unit 105 follows the loudness input slowly. The bottom graph (5) in FIG. 3 shows a comparison of the gain curve with a gain curve of a typical conventional DRC. The most striking difference is that the conventional DRC drastically increases the gain during the short loudness drop at the end.

Figure 4:
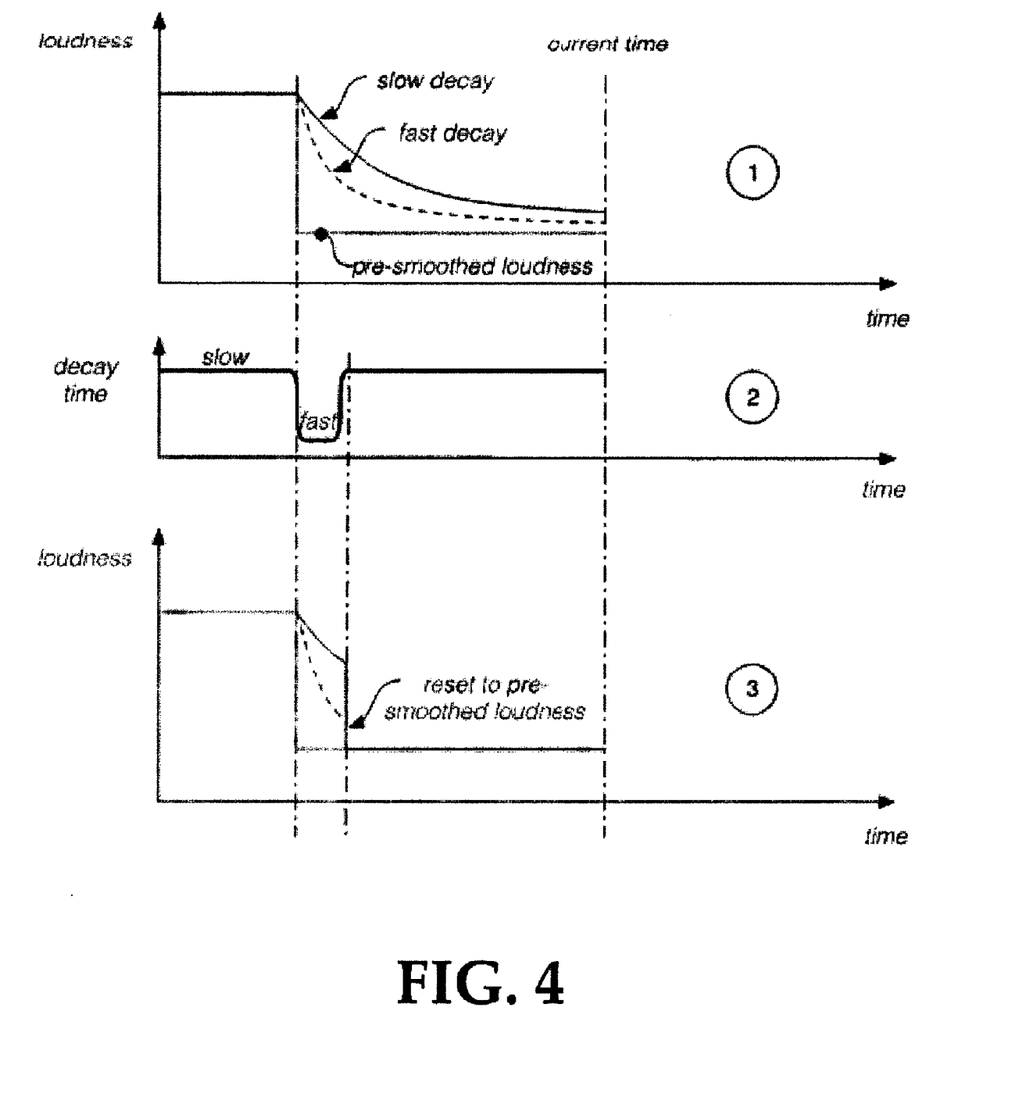
FIG. 4 shows details of decay curve resets after modifying time constants according to one embodiment.

In order to avoid spurious changes of the smoothing time constants, the decay or rise curve units 203, 205, 207, and 209 of the rise and decay time adaptation unit 103 are reset to their input value, which is the pre-smoothed loudness, immediately after a time constant has been reduced and the rise and decay curves are regenerated for the remaining duration as shown in FIG. 4.

FIG. 4 shows in instance (1) a growing loudness change $\Delta_{l,d}$ represented by the growing area between the slow and fast decay curve when current time moves forward. When $\Delta_{l,d}$ reaches a certain threshold, the smoothing time constant is lowered at the crossover point in instance (2). The decay curve units 203 and 205 of the rise and decay time adaptation unit 103 are reset immediately after the smoothing time constant change in instance (3) and the curves are re-generated (they now align with the pre-smoothed loudness in instance (3)). The timing of the reset is motivated by the observation that the loudness change will be greatly reduced when the DRC gain is applied, due to the fast smoothing time constant. Hence, the metrics should be reset at that point to be able to identify the next loudness change that requires a fast smoothing time constant.

The "oldest" time constants $w_{s,d}$ and $w_{s,r}$ from the decay and rise time buffers 217A and 217B are then used to control the smoothing process within the smoothing unit 105. A first order recursive low-pass filter is a simple way to implement this.

$$l_{smooth}(n) \begin{cases} w_{s,d}l_{smooth}(n-1) + (1-w_{s,d})l(n) & \text{if } l_{smooth}(n-1) > l(n) \\ w_{s,r}l_{smooth}(n-1) + (1-w_{s,r})l(n) & \text{else} \end{cases}.$$

The output of the smoothing unit 105 is called "shaped loudness," as shown in FIG. 1, since it has a very similar shape to the final time-varying gain. The shaped loudness is subsequently processed through the input/output characteristic unit 109A to generate the gain values. The characteristic unit 109A maps the shaped loudness to gain values and controls the compression strength. In some embodiments, the gain values are smaller for greater loudness, and vice versa.

Even the fast rise and decay times used here are larger compared with typical time constants of conventional DRCs. This may sometimes result in a slower than necessary gain reduction when the audio content exhibits a sudden attack after a quiet section. The first part of the attack would be amplified and could thus be clipped and/or result in a too-loud event. This problem can be fixed by adding the shaded blocks of FIG. 1 to the DRC system 100 described so far. The shaded units include a conventional DRC 113, such as described above, that works on a highly compressed version of the audio signal (i.e., the characteristic applied here by the characteristics unit 109B results in strong compression). Hence, the input signal of the conventional DRC unit 113 received from the linear domain conversion unit 111B will have consistent loudness except for those transients that are faster than what the smoothing unit 105 can follow. The transients will then trigger a gain reduction (gain C) by the conventional DRC unit 113. This gain reduction is factored into the final gain by multiplication. The gain produced by these units may be applied to the delayed audio signal (delayed by the delay 107B) to produce the compressed audio signal.

The dynamic range controller/system 100 presented here differs from conventional DRCs by a much larger look-ahead time. It takes advantage of the look-ahead by analyzing macroscopic loudness changes in the order of seconds as opposed to the microscopic changes most conventional DRCs are designed to control. This approach avoids most of the typical DRC distortions associated with conventional DRCs and preserves the micro-dynamics of the audio signal. Gain changes are applied at a rate comparable with manual volume adjustments by mixing and mastering engineers to balance a mix. Ideally, the DRC provided by the system 100 will approach what a professional sound engineer would do to reduce the dynamic range if there were only a volume control to accomplish the task on the final mix.

Overall, the large look-ahead permits detection of large loudness changes over the look-ahead time frame and careful timing of the gain adaptation rate adjustments. This is accomplished by robust metrics of the loudness change that result in smooth and non-disturbing gain adjustments for greatly improved listener experience in certain playback scenarios.

In some embodiments, an article of manufacture for performing dynamic range control (DRC) with a large look-ahead on an audio signal, comprises a non-transitory machine-readable storage medium that stores instructions which, when executed by a processor in a computer, generate a loudness estimate for the audio signal; generate adaptive time constants by analyzing the loudness estimate during a predefined look-ahead time period; smooth the loudness estimate using the adaptive time constants; generate DRC gain values to apply to a delayed version of the audio signal based on the smoothed loudness estimate; and apply the DRC gain values to the delayed audio signal.

In one embodiment, the article of manufacture may include further instructions for generating the adaptive time constants, these additional instructions when executed by a processor in the computer pre-smooth the loudness estimate to smooth out transient peaks and dips in the loudness estimate.

In one embodiment, the article of manufacture may include further instructions for generating the adaptive time constants, these additional instructions when executed by a processor in the computer generate one or more decay slopes for the pre-smoothed loudness estimate based on a decay weight $w_D$; and generate one or more rise slopes for the pre-smoothed loudness estimate based on a rise weight $w_R$, wherein the one or more decay slopes and the one or more rise slopes are generated in parallel.

In one embodiment, a decay slope $l_D(n)$ for a time index n in the pre-smoothed loudness estimate is equal to $w_D l_D(n-1)$ when $l_D(n-1)$ is greater than the pre-smoothed loudness estimate at time index n.

In one embodiment, a decay slope $l_D(n)$ for a time index n in the pre-smoothed loudness estimate is equal to the pre-smoothed loudness estimate at time index n when $l_D(n-1)$ is less than or equal to the pre-smoothed loudness estimate at time index n.

In one embodiment, a rise slope $l_R(n)$ for a time index n in the pre-smoothed loudness estimate is equal to $w_R l_R(n-1)$ when $l_R(n-1)$ is less than the pre-smoothed loudness estimate at time index n.

In one embodiment, a rise slope $l_R(n)$ for a time index n in the pre-smoothed loudness estimate is equal to the pre-smoothed loudness estimate at time index n when $l_R(n-1)$ is greater than or equal to the pre-smoothed loudness estimate at time index n.

In one embodiment, the article of manufacture may include further instructions, which when executed by the processor in the computer move the one or more decay slopes and the one or more rise slopes into look-ahead buffers for the predefined look-ahead time period.

In one embodiment, the article of manufacture may include further instructions, which when executed by the processor in the computer analyze the one or more decay slopes in the look-ahead buffers to generate slow and fast decay slopes for each of the one or more decay slopes; and analyze the one or more rise slopes in the look-ahead buffers to generate slow and fast rise slopes for each of the one or more rise slopes.

In one embodiment, the article of manufacture may include further instructions, which when executed by the processor in the computer determine a loudness change for a decreasing loudness time period in the audio signal based on the slow and fast decay slopes; and determine a loudness change for an increasing loudness time period in the audio signal based on the slow and fast rise slopes.

In one embodiment, the adaptive time constants are generated based on the determined loudness changes such that a first adaptive time constant is selected for a first loudness changes and a second adaptive time constant is selected for a second loudness change, wherein the first adaptive time constant is shorter than the second adaptive time constant when the first loudness change is greater than the second loudness change.

In one embodiment, the adaptive time constants are stored in a time constants buffer and the oldest adaptive time constants in the time constants buffer are used to smooth the loudness estimate.

In one embodiment, the article of manufacture may include further instructions, which when executed by the processor in the computer reset the one or more decay slopes and the one or more rise slopes to the pre-smoothed loudness estimate in response to a reduction in an associated adaptive time constant.

In one embodiment, the article of manufacture may include further instructions, which when executed by the processor in the computer process the shaped loudness estimate through a first characteristic function to generate initial gain values; and process the shaped loudness estimate through a second characteristic function to generate gain reduction values for rise and decays slopes, wherein the DRC gain values are generated based on the initial gain values and the gain reduction values.

In one embodiment, the predefined look-ahead time period is between five seconds and ten seconds.

In one embodiment, measurement of the loudness change for the slow and fast decay slopes begins at a decay crossover point between the slow and fast decay slopes wherein the decay crossover point is the last point in time where the slow and fast decay slopes have equal values, and measurement of the loudness change for the slow and fast rise slopes begins at a rise crossover point between the slow and fast rise slopes wherein the rise crossover point is the last point in time where the slow and fast rise slopes have equal values.

As explained above, an embodiment of the invention may be a machine-readable medium such as one or more solid state memory devices having stored thereon instructions which program one or more data processing components (generically referred to here as "a processor" or a "computer system") to perform some of the operations described above. In other embodiments, some of these operations might be performed by specific hardware components that contain hardwired logic. Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method of performing dynamic range control (DRC) with look-ahead on an audio signal, comprising:
   generating a loudness estimate for the audio signal;
   generating adaptive time constants by (i) pre-smoothing the loudness estimate, and (ii) analyzing the pre-smoothed loudness estimate during a predefined look-ahead time period by estimating amounts of change in the pre-smoothed loudness estimate over time intervals, respectively, in the predefined look-ahead time period, wherein estimating the amounts of change in the pre-smoothed loudness estimate comprises generating one or more decay slopes for the pre-smoothed loudness estimate and generating one or more rise slopes for the pre-smoothed loudness estimate;
   smoothing the loudness estimate using the adaptive time constants to produce a shaped loudness estimate;
   generating DRC gain values to apply to a delayed version of the audio signal based on the shaped loudness estimate; and
   applying the DRC gain values to the delayed audio signal.

2. The method of claim 1, wherein a decay slope $l_D(n)$ for a time index n in the pre-smoothed loudness estimate is equal to $w_D l_D(n-1)$ when $l_D(n-1)$ is greater than the pre-smoothed loudness estimate at the time index n.

3. The method of claim 1, wherein a decay slope $l_D(n)$ for a time index n in the pre-smoothed loudness estimate is equal to the pre-smoothed loudness estimate at time index n when $l_D(n-1)$ is less than or equal to the pre-smoothed loudness estimate at the time index n.

4. The method of claim 1, wherein a rise slope $l_R(n)$ for a time index n in the pre-smoothed loudness estimate is equal to $w_R l_R(n-1)$ when $l_R(n-1)$ is less than the pre-smoothed loudness estimate at the time index n.

5. The method of claim 1, wherein a rise slope $l_R(n)$ for a time index n in the pre-smoothed loudness estimate is equal to the pre-smoothed loudness estimate at time index n when $l_R(n-1)$ is greater than or equal to the pre-smoothed loudness estimate at the time index n.

6. The method of claim 1, further comprising:
   moving the one or more decay slopes and the one or more rise slopes into look-ahead buffers for the predefined look-ahead time period.

7. The method of claim 6, further comprising:
   determining a loudness change for a decreasing loudness time period in the audio signal based on slow and fast decay slopes; and
   determining a loudness change for an increasing loudness time period in the audio signal based on slow and fast rise slopes.

8. The method of claim 7, wherein the adaptive time constants are generated based on the determined loudness changes such that a first adaptive time constant is selected for a first loudness change and a second adaptive time constant is selected for a second loudness change, wherein the first adaptive time constant is shorter than the second adaptive time constant when the first loudness change is greater than the second loudness change.

9. The method of claim 8, wherein the adaptive time constants are stored in a time constants buffer and the oldest adaptive time constants in the time constants buffer are used to smooth the loudness estimate.

10. The method of claim 7, wherein determining the loudness change for the decreasing loudness time period comprises a measurement that begins at a decay crossover point between the slow and fast decay slopes wherein the decay crossover point is the last point in time where the slow and fast decay slopes have equal values, and
   wherein determining the loudness change for the increasing loudness time period comprises a measurement that begins at a rise crossover point between the slow and fast rise slopes wherein the rise crossover point is the last point in time where the slow and fast rise slopes have equal values.

11. The method of claim 1, further comprising:
   processing the shaped loudness estimate through a first characteristic function to generate initial gain values; and
   processing the shaped loudness estimate through a second characteristic function to generate gain reduction values for the rise and decay slopes, wherein the DRC gain values are generated based on the initial gain values and the gain reduction values.

12. The method of claim 1, wherein the predefined look-ahead time period is between five seconds and ten seconds.

13. The method of claim 1, further comprising:
resetting the one or more decay slopes and the one or more rise slopes to the pre-smoothed loudness estimate in response to a reduction in an associated adaptive time constant.

14. An article of manufacture for performing dynamic range control (DRC) with a look-ahead on an audio signal, comprising:
a non-transitory machine-readable storage medium that stores instructions which, when executed by a processor in a computer,
generate a loudness estimate for the audio signal;
generate adaptive time constants by (i) pre-smoothing the loudness estimate and (ii) analyzing the pre-smoothed loudness estimate during a predefined look-ahead time period by estimating amounts of change in the pre-smoothed loudness estimate over time intervals, respectively, in the predefined look-ahead time period wherein estimating the amounts of change in the pre-smoothed loudness estimate comprises generating one or more decay slopes for the pre-smoothed loudness estimate, and generating one or more rise slopes for the pre-smoothed loudness estimate;
smooth the loudness estimate using the adaptive time constants, to produce a shaped loudness estimate;
generate DRC gain values by using a characteristic unit to map the shaped loudness estimate, as its input, to the DRC gain values as its output; and
apply the DRC gain values to the delayed audio signal.

15. A system for performing dynamic range control (DRC) with a look-ahead on an audio signal, comprising:
a device, including a hardware processor, the device being configured to:
generate a loudness estimate for the audio signal;
generate adaptive time constants by (i) pre-smoothing the loudness estimate, and (ii) analyzing the pre-smoothed loudness estimate during a predefined look-ahead time period by estimating amounts of change in the pre-smoothed loudness estimate over time intervals, respectively, in the predefined look-ahead time period, wherein estimating the amounts of change in the pre-smoothed loudness estimate comprises generating one or more decay slopes for the pre-smoothed loudness estimate and generating one or more rise slopes for the pre-smoothed loudness estimate;
smooth the loudness estimate using the adaptive time constants to produce a shaped loudness estimate;
generate DRC gain values to apply to a delayed version of the audio signal based on the shaped loudness estimate; and
apply the DRC gain values to the delayed audio signal.

16. The system of claim 15 wherein the device is configured to move the one or more decay slopes and the one or more rise slopes into look-ahead buffers for the predefined look-ahead time period.

17. The system of claim 16 wherein the device is configured to compute a loudness change for a decreasing loudness time period in the audio signal, based on slow and fast decay slopes, and compute a loudness change for an increasing loudness time period in the audio signal, based on slow and fast rise slopes.

18. The system of claim 17 wherein the device is configured to generate the adaptive time constants based on the computed loudness changes wherein a first adaptive time constant is selected for a first loudness change, and a second adaptive time constant is selected for a second loudness change, wherein the first adaptive time constant is shorter than the second adaptive time constant when the first loudness change is greater than the second loudness change.

19. The system of claim 18 wherein the adaptive time constants are stored in a time constants buffer and the oldest adaptive time constants in the time constants buffer are used to smooth the loudness estimate.

20. The system of claim 17 wherein the device is configured to compute the loudness change for the decreasing loudness time period by making a measurement that begins at a decay crossover point between the slow and fast decay slopes, and wherein the device is configured to compute the loudness change for the increasing loudness time period by making a measurement that begins at a rise crossover point between the slow and fast rise slopes.

21. The system of claim 15 wherein the device is configured to process the shaped loudness estimate through a first characteristic function to generate initial gain values, and process the shaped loudness estimate through a second characteristic function to generate gain reduction values for the rise and decay slopes, wherein the DRC gain values are generated based on the initial gain values and the gain reduction values.

22. The system of claim 15 wherein the predefined look-ahead time period is between five seconds and ten seconds.

23. The system of claim 15 wherein the device is configured to reset the one or more decay slopes and the one or more rise slopes to the pre-smoothed loudness estimate in response to a reduction in an associated adaptive time constant.

* * * * *